United States Patent [19]

Luff et al.

[11] Patent Number: 5,568,006

[45] Date of Patent: Oct. 22, 1996

[54] SURFACE MOUNT CRYSTAL PACKAGE WITH RECEPTACLE MOUNTING

[75] Inventors: Marlin Luff, Wheaton; William Skoda, Oak Park; William Kiscellus, Addison, all of Ill.

[73] Assignee: Motorola, Inc., Schaumburg, Ill.

[21] Appl. No.: 431,169

[22] Filed: Apr. 28, 1995

[51] Int. Cl.⁶ .................................................. H01L 41/053
[52] U.S. Cl. ............................................ 310/348; 310/340
[58] Field of Search ..................................... 310/340, 344, 310/348, 354

[56] References Cited

U.S. PATENT DOCUMENTS

| | | | |
|---|---|---|---|
| 2,785,321 | 3/1957 | Imler | 310/344 |
| 4,223,177 | 9/1980 | Nakamura | 310/344 |
| 4,484,158 | 11/1984 | Roberts et al. | 310/348 |
| 5,477,102 | 12/1995 | Miyoshi | 310/344 |

FOREIGN PATENT DOCUMENTS

| | | | |
|---|---|---|---|
| 0072492 | 6/1978 | Japan | 310/348 |
| 0070782 | 6/1978 | Japan | 310/348 |
| 0003486 | 1/1979 | Japan | 310/348 |
| 0187510 | 8/1991 | Japan | 310/348 |

Primary Examiner—Thomas M. Dougherty
Attorney, Agent, or Firm—Gary J. Cunningham; Brian M. Mancini

[57] ABSTRACT

A surface mount crystal package (10) receptacle mounting adapted to canti-leverably receive a piezoelectric element. The surface mount crystal package (10) is configured to hermetically enclose a crystal resonator (19) or crystal filter mounted in a proximal base (12) in a cantilever fashion. This package (10) is hermetically sealed in the proximal base 12, a distal cap (14) and sleeve (16). The package (10) is adapted to improve and faciliate surface mounting, provide a low cost and automatable assembly, and provide a low-stress mounting of a piezoelectric element in a simplified and portable design.

16 Claims, 3 Drawing Sheets

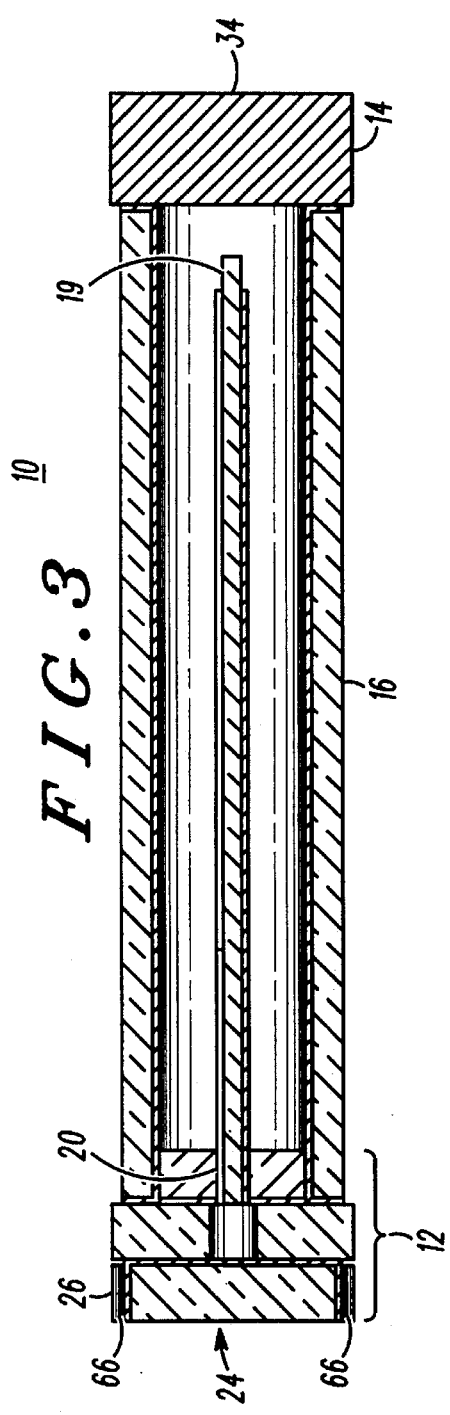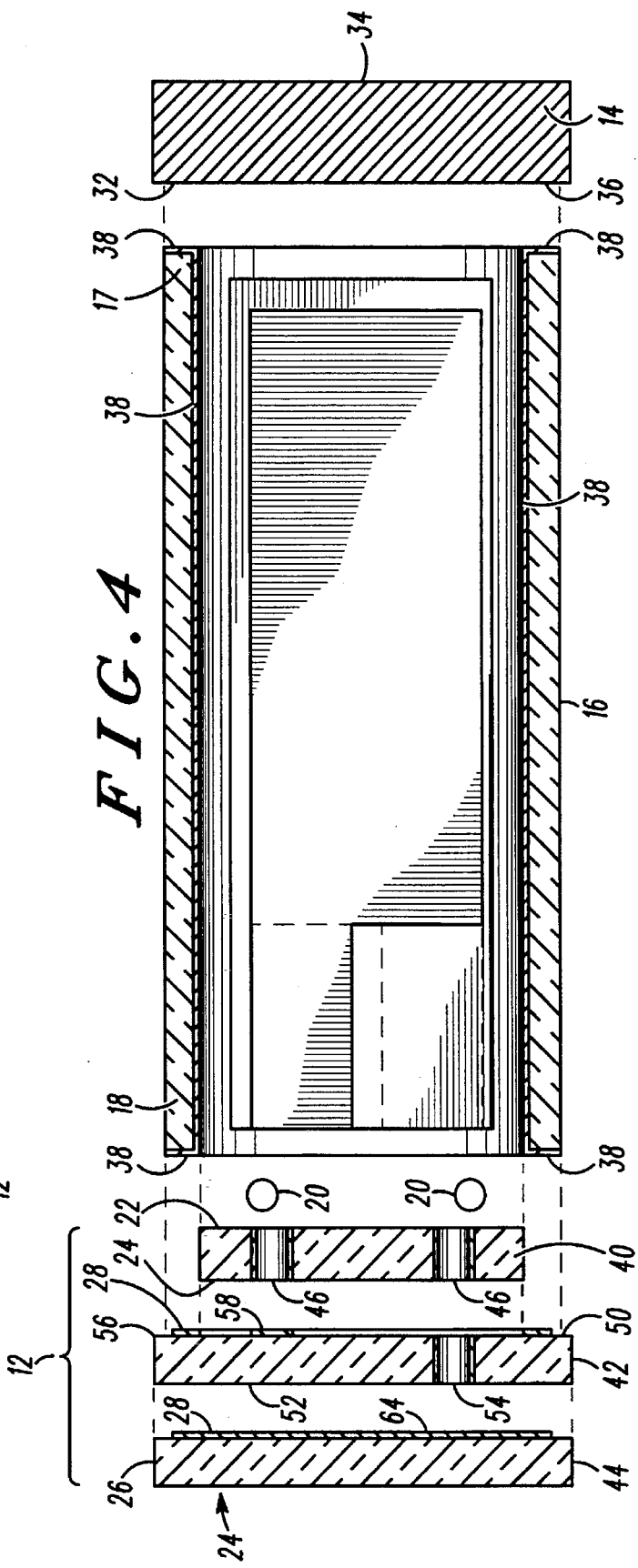

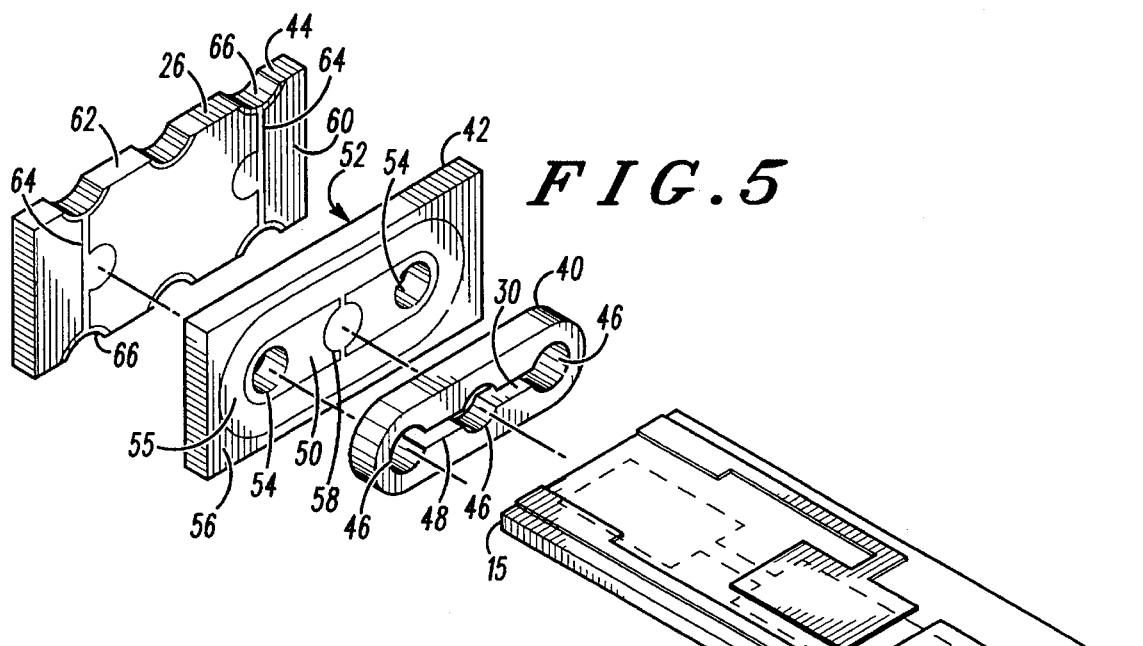
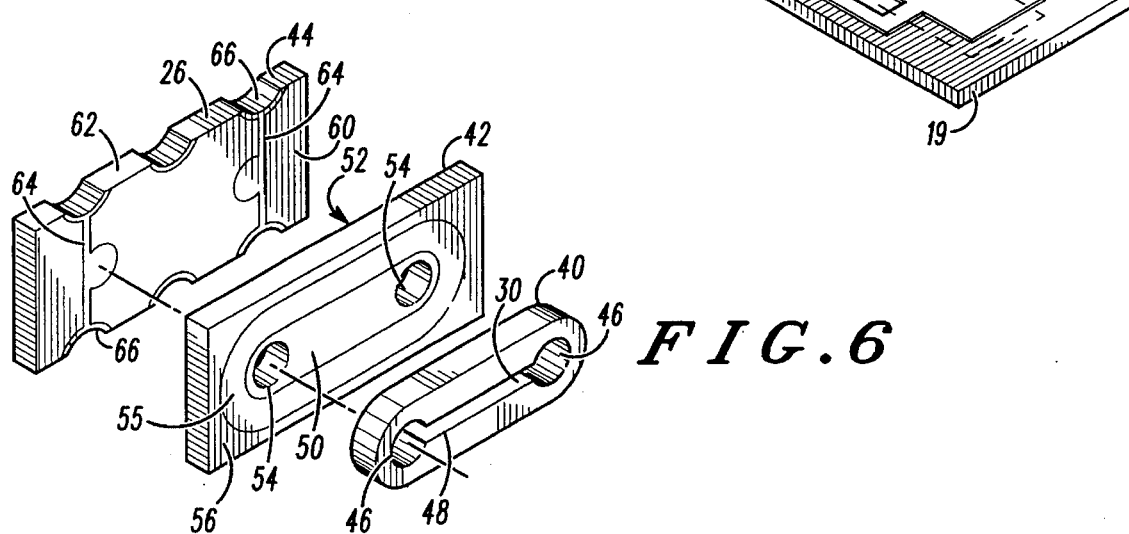
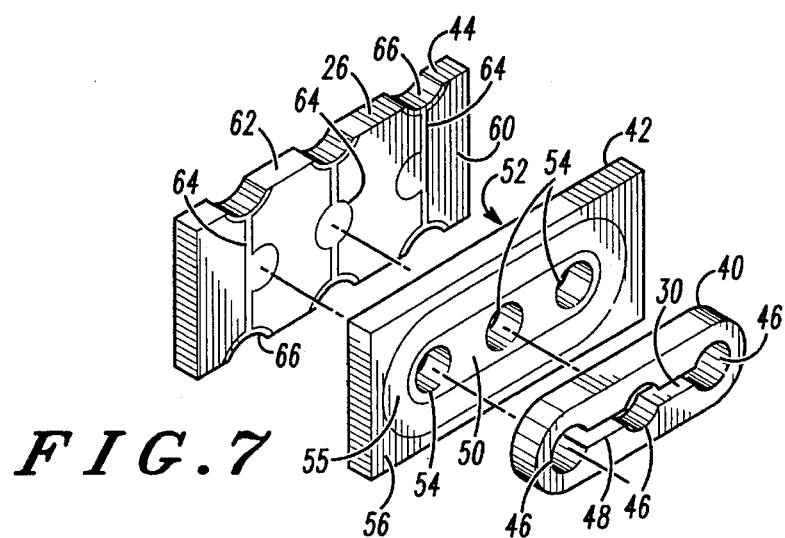

SURFACE MOUNT CRYSTAL PACKAGE WITH RECEPTACLE MOUNTING

FIELD OF THE INVENTION

The present invention relates generally to frequency control devices and, in particular, to a surface mount package with a receptacle mounting for a piezoelectric element.

BACKGROUND OF THE INVENTION

Piezoelectric devices, such as piezoelectric quartz resonators, piezoelectric quartz filters and the like, typically include a piece of piezoelectric material adhesively mounted to base or substrate and hermetically sealed with a lid, can, shield or the like. In quartz devices, the piezoelectric quartz element, of necessity, has thin metallic electrodes deposited on the surface of the quartz through which electrical signals are coupled to the piezoelectric quartz material.

Common problems with piezoelectric devices are effectively isolating the piezoelectric element from the effects of mechanical shock and minimizing mechanical stresses across the piezoelectric element due to mounting.

It is often the case where the piezoelectric element and its packaging are made of material having much different coefficients of thermal expansion. This mismatch induces mechanical stresses across the quartz plate over time and with temperature variations. This structure, in turn, can adversely affect the frequency stability and performance of the quartz device. In addition, with the advent of smaller packaging, locating the piezoelectric element within its packaging becomes more important since the quartz plate is physically closer to the package walls and is therefore more susceptible to damage from mechanical shock.

Two main packaging schemes have been used for mounting quartz devices. In one scheme the quartz plate is held in a package along two or more opposing edges. This minimizes possible mechanical shock effects on the crystal, but the mismatch in thermal coefficients between the quartz and the packaging material causes stress across the active resonating area of the quartz plate. One solution to this problem has been to isolate the quartz plate from external mechanical shock by utilization of spring-like standoffs or other compliant mounting schemes in the package. This adds expense to the package and is not readily automatable. Another solution is to adhesively mount the quartz plate directly to a ceramic base. Although this is attainable and automatable, the ceramic base is expensive and detrimental stresses are induced across the quartz plate, which can affect its frequency performance. In addition, wire bonds are sometimes used to eliminate some of the adhesive mounting points, but this requires additional equipment, and added expenses in terms of time and processing.

The other main packaging scheme involves mounting the crystal substantially at one end leaving the rest of the quartz blank free. This so-called cantilever-type "mounting minimizes the stress across the active resonating area of the quartz plate, but leaves the free end of the quartz plate susceptible to breakage or chipping from mechanical shocks. This damage would change the frequency characteristics of the device. One solution to this problem is to manufacture special assembly tooling to precisely center the quartz plate in its package to minimize the possibility of damage when the quartz plate flexes from external mechanical shocks. This tooling is expensive and is not readily automatable. Another solution is to solidly mount one end of the quartz plate directly to a ceramic base. Although this can be done and is manufacturable by automation, the ceramic base is expensive and the free end of the quartz plate actually touches, or is in proximity to, the package making the plate very susceptible to damage from mechanical shock.

A significant portion of the cost of a quartz device is in its packaging. Therefore, scrap costs due to yield losses are to be avoided if at all possible. Previously, the packaging used for surface mount quartz devices was mostly ceramic packaging which has demonstrated good yields and therefore low incurred scrap costs. However, the ceramic structures themselves, though effective, are complicated and have a higher inherent cost. Cost reduction can be achieved if the packaging for surface mount quartz devices can be simplified and automated without sacrificing yield.

There is a need for an improved package that: (i) is low cost; (ii) minimizes the number of processing steps and separate packaging components; (iii) is robust under automation processes; (iv) is robust under mechanical shocks and environmental testing; (v) minimizes problems from differing thermal expansion coefficients between the crystal resonator and the package materials; and (vi) is hermetic. Accordingly, a low cost, automatable, cantilever-type mount for a piezoelectric device which minimizes stress across the piezoelectric element and precisely positions the element substantially equidistant from the package walls would be considered an improvement over the art.

BRIEF DESCRIPTION OF THE DRAWINGS

FIG. 3 shows an assembled cross-sectional view along lines 3—3 in FIG. 2, of the surface mount crystal package, in accordance with the present invention;

FIG. 4 shows an exploded top cross-sectional view along lines 4—4 in FIG. 2 of the surface mount crystal package, in accordance with the present invention;

FIG. 5 shows an exploded view of a proximal portion of the surface mount crystal package, for use in crystal filtering applications, in accordance with the present invention;

FIG. 6 shows an exploded view of a proximal portion of an alternate embodiment of the surface mount crystal package, in accordance with the present invention; and FIG. 7 shows an exploded view of a proximal portion of another alternate embodiment of the surface mount crystal package, for use in filtering applications, in accordance with the present invention.

DETAILED DESCRIPTION OF THE PREFERRED EMBODIMENT

Figure 1:
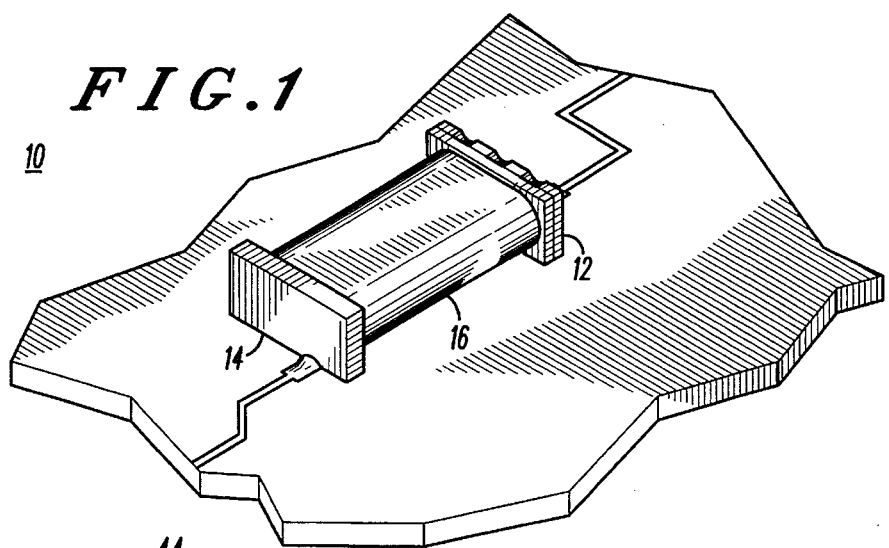
FIG. 1 shows a perspective view of a surface mount crystal package with receptacle mounting, in accordance with the present invention.
Figure 2:
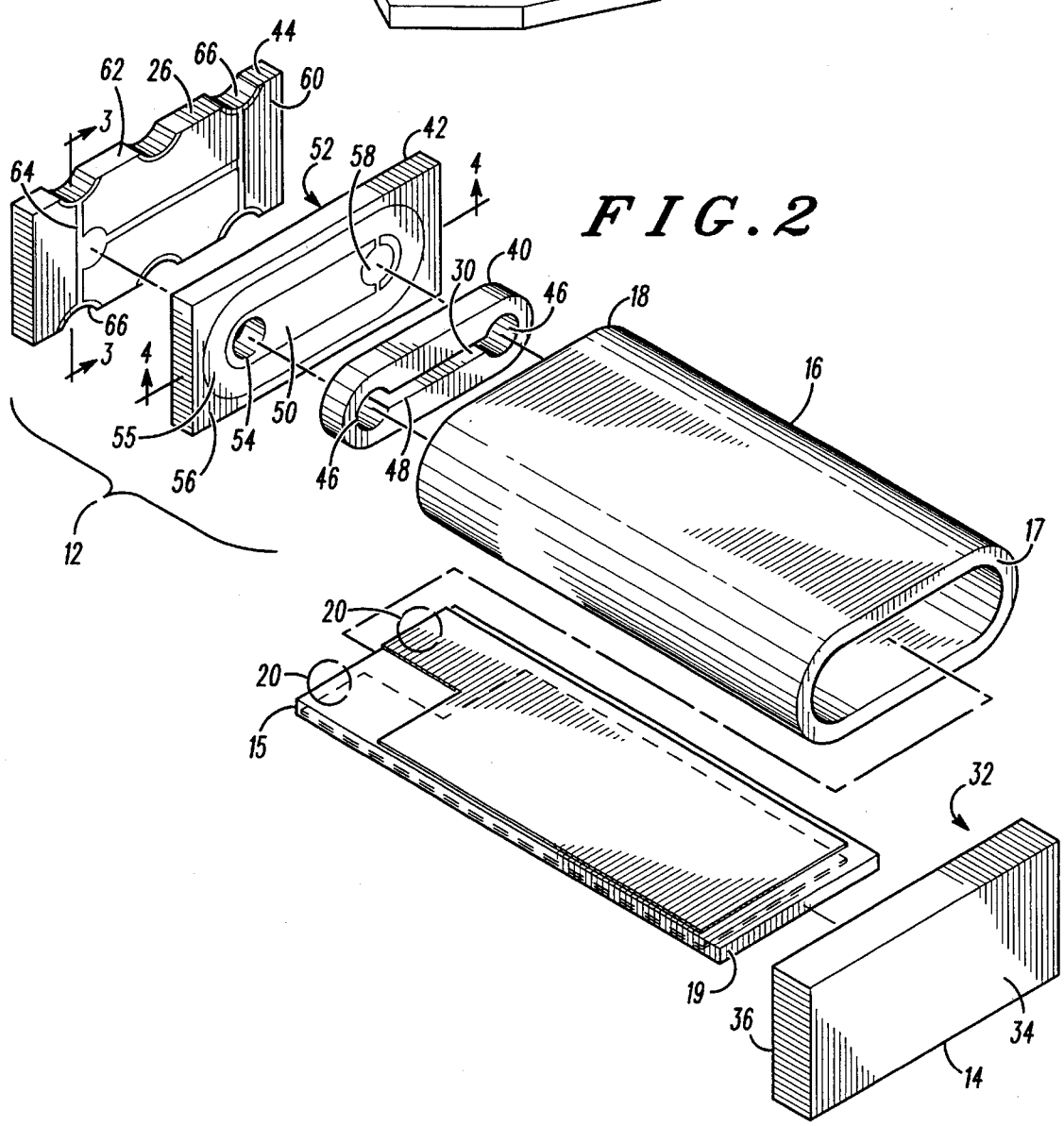
FIG. 2 shows an exploded view of the surface mount crystal package with receptacle mounting, in accordance with the present invention.

FIG. 1 shows a surface mount crystal package (10) that enables hermetic enclosure of a piezoelectric element. The enclosed piezoelectric element shown in FIG. 2 is in the form of a quartz crystal resonator (19), but can include quartz monolithic filter or other piezoelectric device, for example. In its simplest form, the surface mount crystal package (10), includes a proximal base (12), a sleeve (16) and a distal cap (14) which are connected to each other to provide a hermetic environment. The geometry and shape of the proximal base (12) and distal cap (14) can vary widely, and preferably are substantially rectangular in shape, for facilitating surface mounting. In addition, the sleeve (16) is preferably tubular and of a substantially rectangular cross section.

FIG. 2 shows an exploded view of the crystal package (10). The distal cap (14) is preferably a metal or plated metal which can be soldered, such as tin plated Kovar™, or the like. However, the distal cap (14) may be a ceramic with solderable metalized traces.

The sleeve (16) is preferably a ceramic with a substantially fully metalized interior (shown as item 39, in FIG. 4), for surface mounting and electrical connection of cap (14). However, in another embodiment the sleeve (16) may have only a partially metalized interior defining at least one electrically conductive path (39) along its length. Alternatively, the sleeve (16) may be comprised of a metal, such as a copper or zinc alloy, or the like, and may be substantially fully solder plated. In yet another embodiment, the sleeve (16) can be a ceramic material with substantially no conductive metalization along its length.

In a preferred embodiment, the distal cap (14) and the sleeve (16) are unitary or connected before assembly of the remaining components of the package (10). This can be accomplished by having the distal cap (14) and sleeve (16) drawn from one piece of metal, such as a copper, zinc alloy or the like, or having an inner face (32) of the distal cap (14) and a distal portion (17) of the sleeve (16) adhesively connected by brazing, such as with a silver alloy brazing material or the like. Alternatively, the distal cap (14) and the sleeve (16) may be adhesively connected by other conductive and non-conductive hermetic-sealing devices, such as solder, epoxy, silicone, plastic such as a polyimide, glass or the like. Conductive hermetic devices would be preferred, and used when it is desired to have the distal cap (14) form one of the electrical terminations of the crystal package (10). Non-conductive hermetic devices would be used when the distal cap (14) serves as a mechanical mounting point on a printed circuit board (not as an electrical termination).

As shown in FIG. 2, the proximal base (12) is an integral (singular) structure comprising three ceramic layers, including an inner section (40), a middle section (42) and an outer section (44). However, as should be understood, a variety of other configurations and layers could be utilized by one skilled in the art. For example, a viable single or dual layer proximal base (12) could be realized by adding vias to the outer section (44), adding a receptacle to the middle section (42) and eliminating the inner section (40), eliminating the middle section (42) and running metalized traces through vias (54) to the outer edge (62) of the outer section (44), or changing the metalization (28) scheme, for example.

In one embodiment, the outer section (44) includes a metal or plated metal which is solderable, such as tin plated Kovar™ or the like. It can be adhesively and hermetically connected to the middle section (42). Again, as should be understood by those skilled in the art, other metals and platings can be used in connection with the hermetic crystal package (10).

One advantage of using metal assembly parts, for the distal cap (14), the sleeve (16) and the outer section (44) of the proximal base (12) is that metal components are usually of a lower cost. This is measured against the cost of ceramic components, the assembly cost necessary to connect the metal components to the ceramic components, and the cost necessary to add metalization (28) (as shown in FIG. 4), to the ceramic components, in order to provide electrical connections and make the crystal package (10) surface mountable.

In light of the above cost considerations, in a preferred embodiment, the distal cap (14) is the only entirely metal component. However, this does not exclude the possibility that in another configuration of the crystal package (10), other components could be used which are substantially entirely metallic, in a cost-savings embodiment.

In a preferred embodiment shown in FIG. 2, the inner section (40) of the proximal base (12) comprises a ceramic material having an open receptacle (30) extending therethrough. The outer dimension of the inner section (40) is configured to fit into a proximal portion (18) of the sleeve (16) (as illustrated in FIGS. 3 and 4). The receptacle (30) is formed from a slot or channel (48) which is substantially centered in the inner section (40). The walls of the channel (48) are substantially perpendicular to the inwardly and outwardly facing portions (22 and 24) of the proximal base (12) (as shown in FIG. 4). The receptacle (30) thus includes the channel (48) and outer connecting apertures (46). The apertures (46) may be of any number and may be located anywhere along the channel (48). In a preferred embodiment, there are at least two apertures (46) which are located at the ends of the channel (48). The apertures and channel may be of various sizes and shapes. In a preferred embodiment, the channel (48) is configured to receive and securely hold a proximal portion (15) of the crystal resonator (19) substantially in the middle (centered) of the crystal package (10), and the aperatures (46) are filled with a conductive adhesive to mechanically connect the crystal resonator (19) in a canti-levered fashion and provide electrical paths to the electrodes of the crystal resonator (19).

The receptacle (30) provides a low cost canti-lever mounting structure, for precise (central) positioning of the crystal resonator (19) in and along the crystal package (10). This structure can help to minimize possible damage due to mechanical shock, and is adapted to automation, especially in the placement of the solder or conductive adhesive (20) and the crystal resonator (19), which can increase yields and lower costs.

As best shown in FIG. 2, the middle section (42) of the proximal base (12) is preferably made of a ceramic material with an inner surface (50), an outer surface (52), and at least one (open) via (54) extending therethrough. The inner surface (50) is selectively metallized in a generally oval shape, defining a metallized area (55) substantially adjacent to an outer periphery (56) of the middle section (42). In one embodiment, at least one conductive (circular) contact pad (58) is electrically connected to the metallized area (55), adjacent to the right aperature (46) in FIG. 2. The metallized area (55) adjacent to the outer periphery (56) forms a sealing surface that mates with the proximal portion (18) of the sleeve (16). In a preferred embodiment, the metallized area (55) of the middle section (42) is coated with a brazing material or has a pre-attached high eutectic temperature solder preform. It should be recognized by those skilled in the art, that various brazing and soldering materials, techniques and applications can be used in the assembly and construction of the crystal package (10), and are considered within the scope of this invention.

The outer section (44) of the proximal base (12) is preferably made of a ceramic material. It further includes an interior face (60) and an outer edge (62). The interior face (60) is selectively metalized (28) to provide at least one metalized pad (64) with electrical traces extending from the interior face (60) to and terminating at the outer edge (62). In a preferred embodiment, the electrical traces terminate in castellations (66) located on the outer edge (62) of the outer section (44). These castellations (66) provide surface mountable terminations of the crystal package (10).

As best shown in FIGS. 2–4, the crystal package (10) has at least one aperture (46) of the inner section (40) aligned with at least one via (54) of the middle section (42) and at least one metalized pad (64) of the outer section (44). This forms a blind hole which is substantially filled with conductive adhesive during assembly (20), forming at least one (electrical and mechanical) connection from the crystal resonator (19) to the castellations (66). This structure provides surface mountable terminations of the crystal package (10), as shown in FIG. 1.

In addition, as shown in FIGS. 2 and 4, at least one other aperture (46) of the inner section (40) is aligned with at least one contact pad (58) of the middle section (42). This forms a blind hole which can be filled with conductive adhesive (20), for forming a connection from the crystal resonator (19) or filter to the contact pad (58) of the middle section (42). This in turn is connected to the metallized area (55) of the middle section (42), which is also connected to the electrically conductive path (38) of the sleeve (16), which is in turn further electrically connected with the distal cap (14), where a distal conductive portion (36) provides the other surface mountable termination of the crystal package (10), shown in FIG. 1.

Alternative embodiments of the proximal base (12) are shown in FIGS. 5 and 6. FIGS. 1–4 show a preferred embodiment of a crystal resonator package (10), for surface mounting as shown in FIG. 1. FIG. 6 is an alternative embodiment of FIG. 2. FIG. 5 shows an embodiment adapted to receive a crystal filter (in a canti-levered fashion), of FIG. 5 in the proximal base (12). FIG. 7 is an alternate embodiment.

More particularly, FIGS. 6 and 7 show alternative embodiments of the proximal base (12) of a crystal resonator package (10) and a crystal filter package, respectively. For these embodiments, the proximal base (12) is integrally assembled (the components are completely connected). They have at least two apertures (46) of the inner section (40) aligned with at least two respective vias (54) of the middle section (42) and at least two respective metallized pads (64) of the outer section (44). This structure forms blind holes which can be substantially filled with conductive adhesive during assembly (20) forming at least two connections from the crystal resonator (19) or filter to the castellations (66). This structure provides surface mountable terminations of the crystal package (10). In these two embodiments, a conductive path through the sleeve (16) to the distal cap (14) is not required, since all the terminations of the device lead to the castellations (66) at the proximal base 12. Further, in these embodiments it is not required to use conductive adhesives in the assembly of the sleeve (16) to the proximal base (12) and the distal cap (14).

For these embodiments (FIGS. 6 and 7), the sleeve (16) can be pre-applied with a non-conductive epoxy on the distal portion (17) and proximal portion (18) of the sleeve (16) (as shown in FIGS. 2 and 4). Alternatively, glass frit may be applied to the distal portion (17) and proximal portion (18) of the sleeve (16) and/or the sealing surface on the inner face (32) of the distal cap (14) and the metallization (52) adjacent to the outer periphery (56) of the middle section (42) (as shown in FIG. 2). The distal portion (17) of the sleeve (16) is aligned with the inner face (32) of the distal cap (14), and the proximal portion (18) of the sleeve (16) is aligned with the inner surface (50) of the middle section (42) of the proximal base (12), and then the adhesives are substantially simultaneously cured or fired to form a hermetic crystal package (10).

Advantageously, the proximal base (12) can include many small and complicated electrical connections in an integrated mounting structure, which can be produced in a cost effective manner. Further, no additional devices such as springs, clips or pins are required to support and mount a piezoelectric element, as is required in many prior art devices.

In a preferred embodiment, the assembly of the crystal package (10) can include the following. First, applying and substantially filling the apertures (46) and via (54) of the proximal base (12) with a conductive adhesive (20), such as a conductive epoxy, conductive silicone, solder or the like. Next, the crystal resonator (19) is inserted into the receptacle (30) to engage the conductive adhesive (20). Then the conductive adhesive (20) is cured. As detailed above, the piezoelectric element might also be a quartz crystal monolithic filter (such as one shown in FIG. 5) or other piezoelectric device.

For added rigidity and mounting strength, and to minimize the possibility of the conductive adhesives (20) shorting together, a nonconductive adhesive may be directly applied in the channel (48) of the receptacle (30) before inserting the crystal resonator (19).

Next, the crystal resonator (19) would be frequency adjusted, such as by adding metal to one or more of the electrodes in a conventional manner. After frequency adjustment, the crystal resonator (19) is hermetically sealed, preferably in an inert environment, by connecting the distal cap (14), the sleeve (16) and the proximal base (12). In a preferred embodiment, this can be accomplished by the use of a high eutectic temperature solder which has been pre-applied to the distal portion (17) and proximal portion (18) of the sleeve (16). It should be recognized, that various soldering materials, techniques and applications can be used in the assembly and construction of the crystal package (10).

In another embodiment, the distal cap (14) and sleeve (16) are not unitary (the components 40, 42 and 44 are not pre-connected). First, the distal portion (17) and proximal portion (18) of the sleeve (16) are pre-applied with a high eutectic temperature solder. Similarly, a pre-applied high eutectic temperature solder can be applied to the sealing surface on the inner face (32) of the distal cap (14) and the metallization (55) of the middle section (42) of the proximal base (12) (as shown in FIG. 2). Alternatively, substantially the entire sleeve (16) can be plated with solder. The distal portion (17) of the sleeve (16) is then aligned with the inner face (32) of the distal cap (14) and the proximal portion (18) of the sleeve (16) is aligned with the inner surface (50) of the middle section (42) of the proximal base (12), and then the adhesives are substantially simultaneously reflowed to form a hermetic crystal package (10).

As should be understood by those skilled in the art, various combinations of the above steps and adhesives can be used to hermetically seal the peripheral portion of base (12), sleeve (16) and distal cap (14) of the crystal package (10).

In operation, the surface mount crystal package (10) is a surface mount electrical device with at least two terminals, as shown in FIG. 1. In a two terminal device shown in FIG. 2, the distal cap (14) serves as a first terminal electrically connecting, through the package, to one side of the crystal resonator (19). The castellations (66) on the outer edge (62) of the outer section (44) of the proximal base (12) serve as a second terminal electrically connecting, through the package (10), to the other side of the crystal resonator (19).

In another preferred embodiment, the distal cap (14) is left electrically floating, as shown in FIGS. 6 and 7. This is accomplished by having a sleeve (16) without an electrically conductive path (39) or not connecting it. The distal cap (14) may still be used for a mechanical mounting point on a printed circuit board, but the two independent electrical terminals are located on the proximal base and are connected from the castellations (66) on the outer edge (62) of the outer section (44) of the proximal base (12) (shown in FIG. 5) through two outer vias (54) electrically connecting to either side of the crystal resonator (19).

In a three terminal device, as shown in FIGS. 5 and 7, a crystal monolithic filter could be hermetically sealed in package (10). In FIG. 5, the distal cap (14) serves as a first terminal, preferably a ground, electrically connecting, through the package (10), to the filter ground connection of monolithic filter resonator (19). The far left and right castellations (66) of the outer section (44) of the proximal base (12) (shown in FIGS. 5 and 7), serve as the input and output terminals electrically connecting, through the package, to the filter hot connections of the resonator (19). The middle castellation (66) is connected to ground in FIG. 7.

In another preferred embodiment, the distal cap (14) may be left electrically floating. This is accomplished by having a sleeve (16) without any electrically conductive path (39). The distal cap (14) might still be used for a mechanical mounting point on a printed circuit board, but the three independent electrical terminals are located on the proximal base (12) and are connected from the castellations (66) of the outer section (44) of the proximal base (12) (shown in FIG. 7), through three vias (54) electrically connecting to the ground and hot sides of the crystal filter resonator (19).

The advantage of the hermetic package (10) of this invention, comes from its combination of low cost materials, leadless surface mountability, cantilever-type mount for improved reduction of stress to the crystal resonator or filter, improved mechanical shock isolation, robustness for automated assembly, and improved yield and cost savings due to assembly process simplification.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A surface mountable crystal package, comprising:
    a proximal base including an inner, middle and outer section having connecting metalization for providing an electrical path;
    the inner section comprises a dielectric material and has a substantially oblong receptacle defined by two aperture sections connected with a channel being substantially complementarily configured to receive at least a proximal portion of a crystal resonator;
    a distal cap having an inner face, an outer face and a distal conductive portion;
    a sleeve having a distal portion and a proximal portion, the distal portion being connected to the distal cap and the proximal portion being connected to the proximal base; and
    the inner section of the proximal base being configured to at least partially be received in the sleeve.

2. The surface mountable crystal package of claim 1, wherein:
    the middle section comprises a dielectric material including inner and outer surfaces;
    the inner surface including at least one via and having selective metalization substantially adjacent to an outer periphery; and
    the metalization adjacent to the outer periphery is configured to abut and be connected to the sleeve.

3. The surface mountable crystal package of claim 2, wherein the middle section includes at least one centrally located conductive contact pad being connected to the selective metalization.

4. The surface mountable crystal package of claim 3, wherein:
    the outer section comprises a dielectric material including an interior face and at least one outer edge adapted for surface mountability; and
    the interior face being selectively metalized to provide at least one metalized pad connecting to at least one of a plurality of metalized connections on the outer edge.

5. The surface mountable crystal package of claim 1, wherein the outer section comprises a conductive material.

6. The surface mountable crystal package of claim 5, wherein the outer section comprises a metal.

7. The surface mountable crystal package of claim 4, wherein the outer edge of the outer section has a plurality of castellations, the metalized connections on the outer edge being located substantially within the plurality of castellations.

8. The surface mountable crystal package of claim 3, wherein the at least one aperture of the inner section is aligned with the at least one contact pad of the middle section.

9. The surface mountable crystal package of claim 4, wherein the at least one aperture of the inner section is aligned with the at least one via of the middle section and the at least one metalized pad of the outer section.

10. The surface mountable crystal package of claim 1, wherein the inner, middle and outer sections are integrally connected, whereby a hermetic environment is providable.

11. A surface mountable crystal package having at least two terminals, comprising:
    a proximal base including an inner, middle and outer section having connecting metalization for providing at least one electrical path;
    the inner section comprises a dielectric material and has a substantially oblong receptacle adapted to receive a crystal resonator, the inner section being configured to at least partially be received in the sleeve:
    a crystal resonator having first and second sides;
    the receptacle being substantially complementarily configured to receive at least a proximal portion of the crystal resonator;
    a distal cap having an inner face, an outer face, and a distal conductive portion;
    a sleeve having a distal portion and a proximal portion, the proximal portion being adhesively attached to the proximal base, and the distal portion being adhesively attached to the inner face of the distal cap; and
    the outer section includes an outer edge, the outer edge having a plurality of metalized castellations, at least one of the castellations being electrically coupled through connecting metalization of the proximal base of the first side of the crystal resonator.

12. The surface mountable crystal package of claim 11, wherein the sleeve has at least one electrically conductive path substantially along its length, the second side of the crystal resonator being electrically connected to the distal conductive portion through the conductive path.

13. A surface mountable crystal package, comprising:
    a proximal base comprising a dielectric material and having inner, middle and outer sections being integrally connected;

the inner section having a receptacle including at least two outer apertures connected by a channel, the receptacle being substantially complementary configured to receive at least a portion of a crystal resonator, and the inner section being partially received in a sleeve;

the middle section having inner and outer surfaces, the inner surface including at least one via and having selective metalization substantially adjacent to an outer periphery, whereby the metalization adjacent to the outer periphery is configured to abut the sleeve;

the outer section having an interior face and an outer edge adapted for surface mountability, the interior face is selectively metalized providing at least one metalized pad connected to at least one metalized castellation on the outer edge;

at least one aperture of the inner section is substantially aligned with at least one via of the middle section and at least one metalized pad of the outer section;

a distal cap having an inner face, an outer face, and a distal conductive portion adapted for surface mountability;

the sleeve having a distal portion and a proximal portion, the proximal portion being adhesively attached to the inwardly facing portion of the proximal base, and the distal portion being adhesively attached to the inner face of the distal cap; and a crystal resonator substantially cantileverably coupled and at least partially received in the receptacle.

14. The surface mountable crystal package of claim 13, wherein at least one contact pad being connected to the selective metalization of the middle section, and having at least one aperture of the inner section being aligned with at least one contact pad, the sleeve having at least one electrically conductive path substantially along its length.

15. The surface mountable crystal package of claim 13, wherein the crystal resonator is enclosed in a hermetic environment.

16. The surface mountable crystal package of claim 13, wherein the crystal resonator is a filter with three electrical connections, at least two connections are provided by at least two castillations on the outer edge of the proximal base.

* * * * *